United States Patent [19]
Okada et al.

[11] Patent Number: 5,003,360
[45] Date of Patent: Mar. 26, 1991

[54] SEMICONDUCTOR FUNCTIONAL ELEMENT

[75] Inventors: Makoto Okada, Isehara; Naoki Yokoyama, Atsugi, both of Japan

[73] Assignee: Fujitsu Limited, Kawasaki, Japan

[21] Appl. No.: 379,928

[22] Filed: Jul. 14, 1989

[30] Foreign Application Priority Data

Jul. 15, 1988 [JP] Japan .................. 63-175071

[51] Int. Cl.$^5$ ............................. H01L 29/80
[52] U.S. Cl. ...................... 357/22; 357/16; 357/15
[58] Field of Search .............. 357/22 A, 22 J, 22 F, 357/22 I, 16, 20, 4, 15, 22 K

[56] References Cited

U.S. PATENT DOCUMENTS

| | | | |
|---|---|---|---|
| 4,257,055 | 3/1981 | Hess et al. | 357/4 |
| 4,550,330 | 10/1985 | Fowler | 357/16 |
| 4,636,824 | 1/1987 | Ikoma et al. | 357/4 |
| 4,704,622 | 11/1987 | Capasso et al. | 357/16 |
| 4,733,282 | 3/1988 | Chang et al. | 357/16 |
| 4,745,452 | 5/1988 | Sollner | 357/4 |
| 4,780,749 | 10/1988 | Schulman | 357/16 |
| 4,806,998 | 2/1989 | Vinter et al. | 357/22 A |
| 4,942,437 | 7/1990 | Fowler et al. | 357/16 |

FOREIGN PATENT DOCUMENTS

| | | | |
|---|---|---|---|
| 61-159769 | 1/1985 | Japan | 357/16 |
| 63-093161 | 10/1986 | Japan | 357/22 |
| 0205967 | 8/1988 | Japan | 357/22 A |

OTHER PUBLICATIONS

Ford et al., "Electrostatically ... Effect", Appl. Phys. Lett. 54(1), 2 Jan. 1989.

Primary Examiner—Rolf Hille
Assistant Examiner—Minhloan Tran
Attorney, Agent, or Firm—Staas & Halsey

[57] ABSTRACT

A semiconductor functional element is composed of at least one bifurcated branch conductive path coplanar with a heterojunction in a semiconductor with a band discontinuity that produces a potential well, and at least two gate electrodes designed for digital operations and a common electrode facing each other. The gate electrodes cross both paths and the two gate electrodes are located outside of one path and the common electrode is located outside the other path so that electron wave conditions at the heterojunction are locally influenced by an electric field which can be changed by selecting a gate electrode to apply a voltage thereby forming a logic or a functional circuit.

23 Claims, 6 Drawing Sheets

SEMICONDUCTOR FUNCTIONAL ELEMENT

BACKGROUND OF THE INVENTION

1. The present invention relates to an electrical signal element that requires very little physical space and dissipates very little energy. More particularly, the present invention relates to a semiconductor functional element using a quantum interference effect.

2. Description of the Related Art

Generally, in semiconductor integrated circuit devices, a required logic circuit or a functional unit is composed of a combination of plural transistors whose fundamental gate characteristics are previously known.

In conventional semiconductor integrated circuit devices, there are three major problems as follows.

(1) There is no way to advance the degree of integration of semiconductor integrated circuits except to decrease the size of each transistor included in the circuit, thereby causing a problem in that the limits of technology are reached or a physical barrier results from a large amount of heat due to large scale integration.

(2) A large number of transistors are required depending on the complexity of the design, in order to construct a complicated functional unit, since the gate characteristics of each transistor are simple. The usage of many transistors in the unit reduces the working speed of the unit even though the switching speed of each transistor itself is fast.

(3) The response characteristics of the transistors against changes in external input signals are uniform thus making circuit design using the transistors convenient for circuit designers. On the other hand, these characteristics of the transistors constitute a disadvantage when constructing a neural network requiring complicated responses to changes in external input signal.

SUMMARY OF THE INVENTION

The object of the present invention is to provide a semiconductor functional element being physically small and dissipating very little energy, which can function as a logic circuit or a functional unit and can respond in many ways to changes in external input signals.

According to the present invention, a semiconductor functional element which functions as a logic circuit or functional unit, such as an exclusive NOR circuit, a half adder, a full adder, or an n bit D/A converter, is provided. Thus, the following major advantages are obtained according to the present invention.

① Physical space requirements and energy dissipation are reduced.

② Working speed becomes faster than the conventional logical circuits or functional units composed of many transistors.

③ Response characteristics against a change in external input signal become complicated enough to use for a neural network.

BRIEF DESCRIPTION OF THE DRAWINGS

The present invention will be more clearly understood from the description below with reference to the accompanying drawings, wherein.

DESCRIPTION OF THE PREFERRED EMBODIMENTS

Before describing the preferred embodiments of the present invention, an explanation will be given of the conventional quantum interference effect using a quantum interference effect element model such as a semiconductor functional element known as a semiconductor interferometer shown in FIG. 1, and characteristic curves shown in FIGS. 2 and 3.

Figure 1:
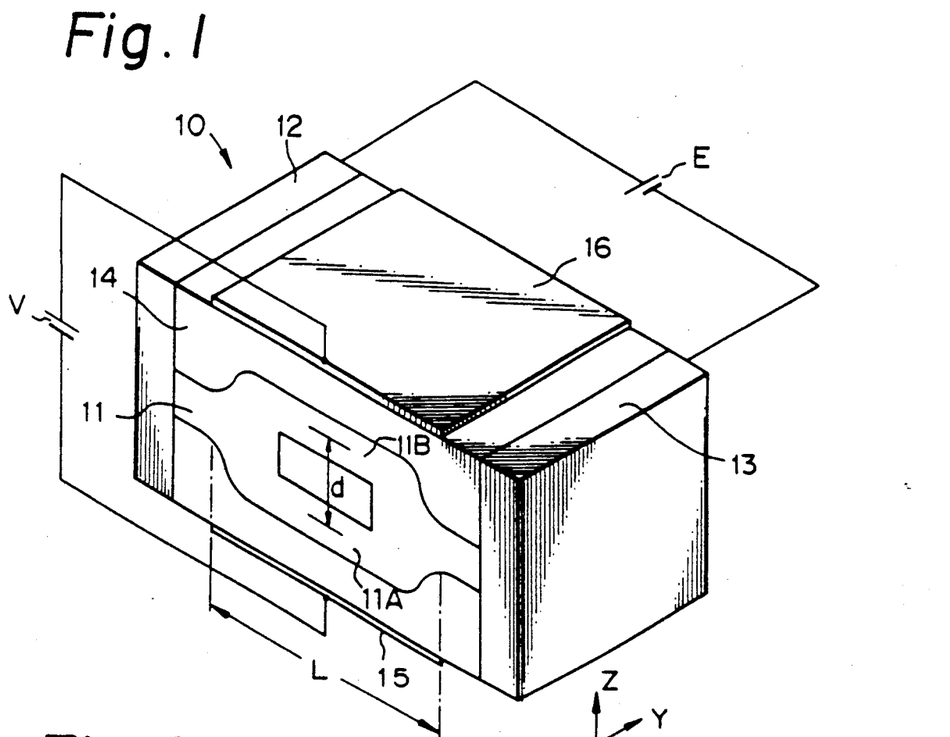
FIG. 1 is a schematic illustration of a quantum interference effect element model for explaining a quantum interference effect.

The quantum interference effect element shown in FIG. 1 is constructed similar to the semiconductor interferometer shown in U.S. Pat. No. 4,550,330, issued Oct. 29, 1985, to Alan B. Fowler et al., disclosing that "An interferometer is constructed by providing a bifurcated branch conductive path coplanar with a heterojunction in a semiconductor with a band discontinuity that produces a potential well so that electron wave conduction at the heterojunction can be locally influenced with an electric field applied to one branch of the bifurcated path." Further, development and research an the quantum interference effect is now proceeding, for example, see "S. Datta et al. Phys. Rev. Lett. 55 1985 p. 2344", "S. Datta et al. Appl. Phys. Lett. 48 1986 p. 487", and "S. Bandyopadhyay et al IEDM-86 Tech. Dig. p. 76".

In FIG. 1, reference numeral 10 indicates a quantum interference effect element, 11 indicates a channel made of GaAs where electrons travel, 11A and 11B indicate a bifurcated branch conductive path, 12 indicates an input contact, 13 indicates an output contact, 14 indicates a nonconductive layer made of AlGaAs which forms a "barrier" as compared with a "well", 15 and 16 indicate electrodes, L indicates the length of a bifurcated branch path, and E and V indicate power sources.

In a quantum interference effect element as constructed above, when a signal is provided at the input contact 12, wave functions of an electron are divided into two groups at the bifurcated point of the channel 11. One group of wave functions of an electron travels in a branch path 11A and the other group of wave functions of an electron travels in a branch path 11B, both groups of wave functions of an electron are then added together after traveling through the path 11A and 11B and arriving at the output contact 13. In this process, when the electric field is applied to the paths 11A and 11B by connecting the electrodes 15 and 16 to the power source V or the magnetic field perpendicular to the paths 11A and 11B is applied, a wave function of electrons in the paths 11A and 11B is influenced by the local electric field or magnetic field and a phase shift occurrs according to the potential of the field thereby causing a wave inteference when the two groups of electrons are added together. In other words, the amount of phase shift of the electrons is different in the path 11A and the path 11B when the electric or magnetic field is applied thereby causing a phase difference between the electrons in the paths 11A and 11B. The transmission factor due to the wave interference is expressed as shown in Equation 1 using a conductance G.

$$G = G_0(1 + [\cos \phi])  \quad \text{Eq. 1}$$

where 2 $G_0$ is the conductance when there is no wave interference ($\cos \phi = 1$), parentheses ([ ]) are the ensemble average of electrons, and $\phi$ is the phase difference value in the wave function of electrons due to the application of the electric field or the magnetic field.

The phase difference value $\phi$ when the electric field is applied is expressed as shown in Equation 2 as a function of $\epsilon_z$ (electrostatic Aharonov-Bohm effect).

$$\phi = e^* \epsilon_z {}^* L {}^* d/n {}^* Vx \quad \text{Eq. 2}$$

where e is an elementary quantity of electric charge, $\epsilon_z$ is an electric field applied to the branch paths 11A and 11B in the direction of Z, L is the length of the branch paths 11A and 11B, d is a distance between the center of the branch paths 11A and 11B, n is a Planck's constant, and Vx is a traveling speed of the electrons. As explained above, the phase difference value can be controlled by changing the strength of the electric field applied to the branch paths 11A and 11B, thereby controlling the conductance G. In this way, the conductance G alternates as a function of the phase difference $\phi$.

Figure 2:
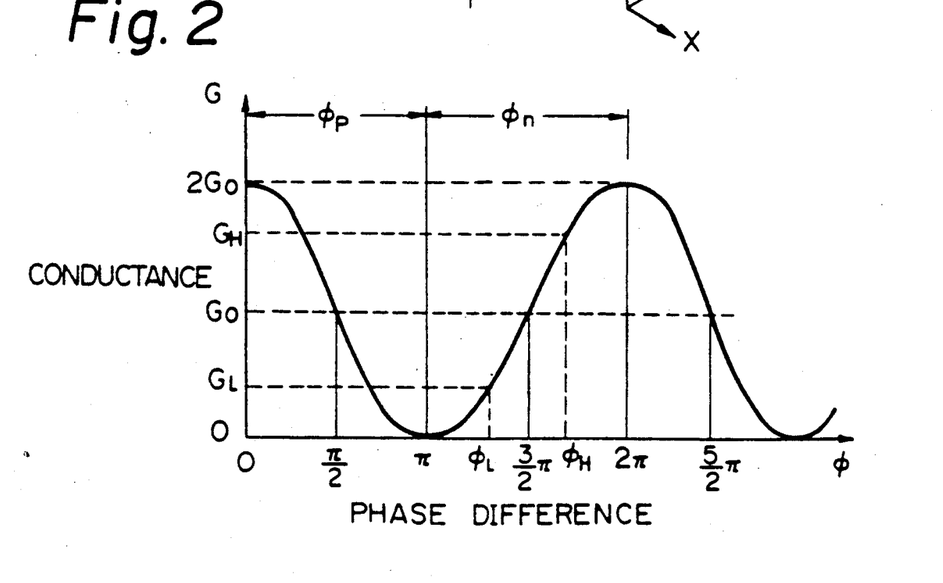
FIG. 2 is a chart for explaining the characteristics of changes in the conductance and phase difference in each branch conductive path in FIG. 1.
Figure 3:
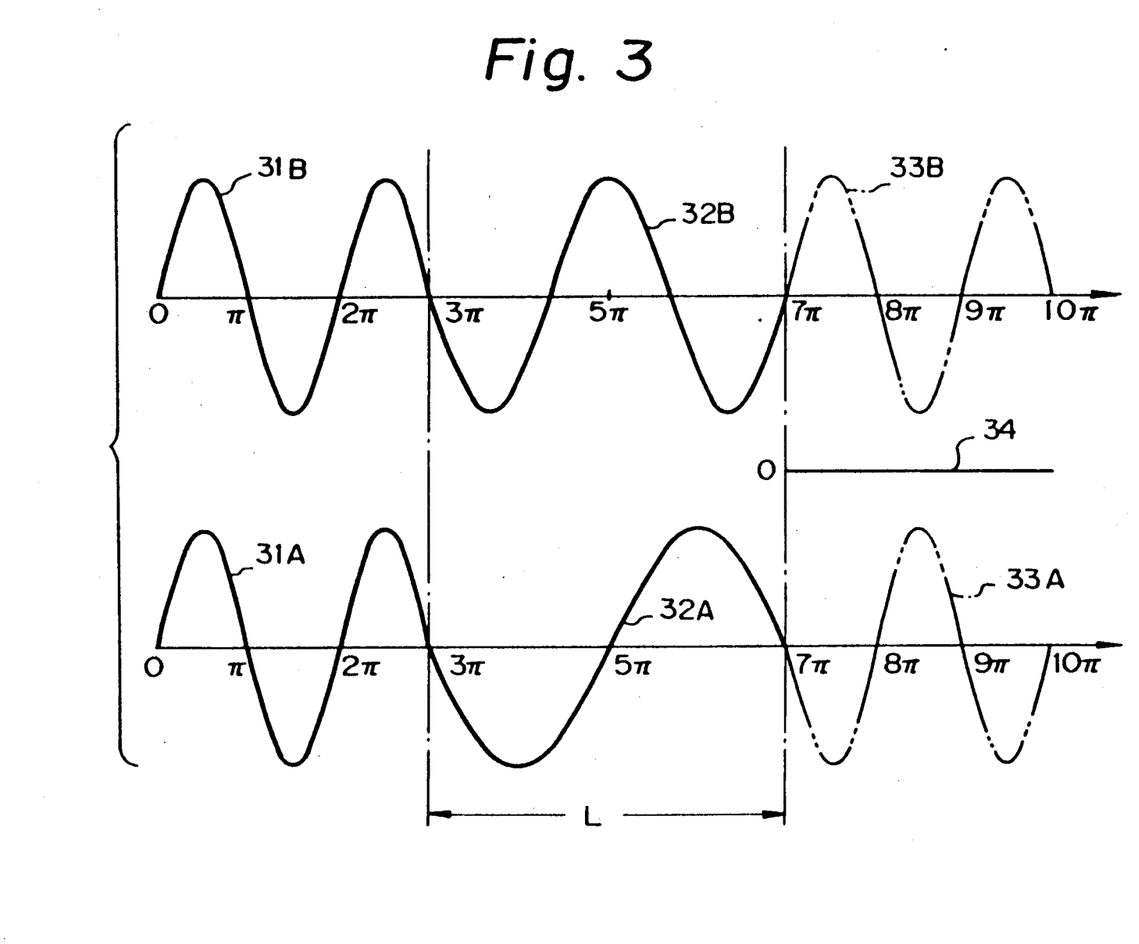
FIG. 3 shows waveforms for explaining the operation of the signal applied at an input contact of the element shown in FIG. 1.

FIG. 2 is a chart for explaining the characteristics of change the conductance G (vertical axis) and the phase difference $\phi$ (horizontal axis) in each branch path 11A and 11B. FIG. 3 shows waveforms for explaining the operation of the signal applied at the input contact 12 of the semiconductor functional element 10 shown in FIG. 1. In FIG. 3, reference numerals 31A and 31B indicate waveforms of the signal traveling in the channel 11 before the branch paths 11A and 11B, 32A indicates a waveform of the signal traveling in the branch path 11A, 32B indicates a waveform of the signal traveling in the branch path 11B, 33A and 33B indicate the phantom waveforms of the signal in the channel 11 after the branch paths 11A and 11B when two signals exist without being added together, and 34 indicates a real output signal from the output contact 13 after the addition of the two waveforms 33A and 33B. In this embodiment, the phase of the signal traveling in the branch path 11A is shifted $2\pi$, and in the branch path 11B is shifted $\pi$ by adjusting the strength of the electric field applied to the element 10 in order to cancel the output signal.

In this way, the quantum interference effect in the conventional semiconductor functional element shown in FIG. 1 changes by the parameter $\epsilon_z$. Contrary to this, the most important point of the present invention described hereinafter is that the phase difference value $\phi$ in Equation 2 effectively changes by the parameter L and thereby the functions of the semiconductor functional element as a digital circuit can be utilized effectively.

Figure 4:
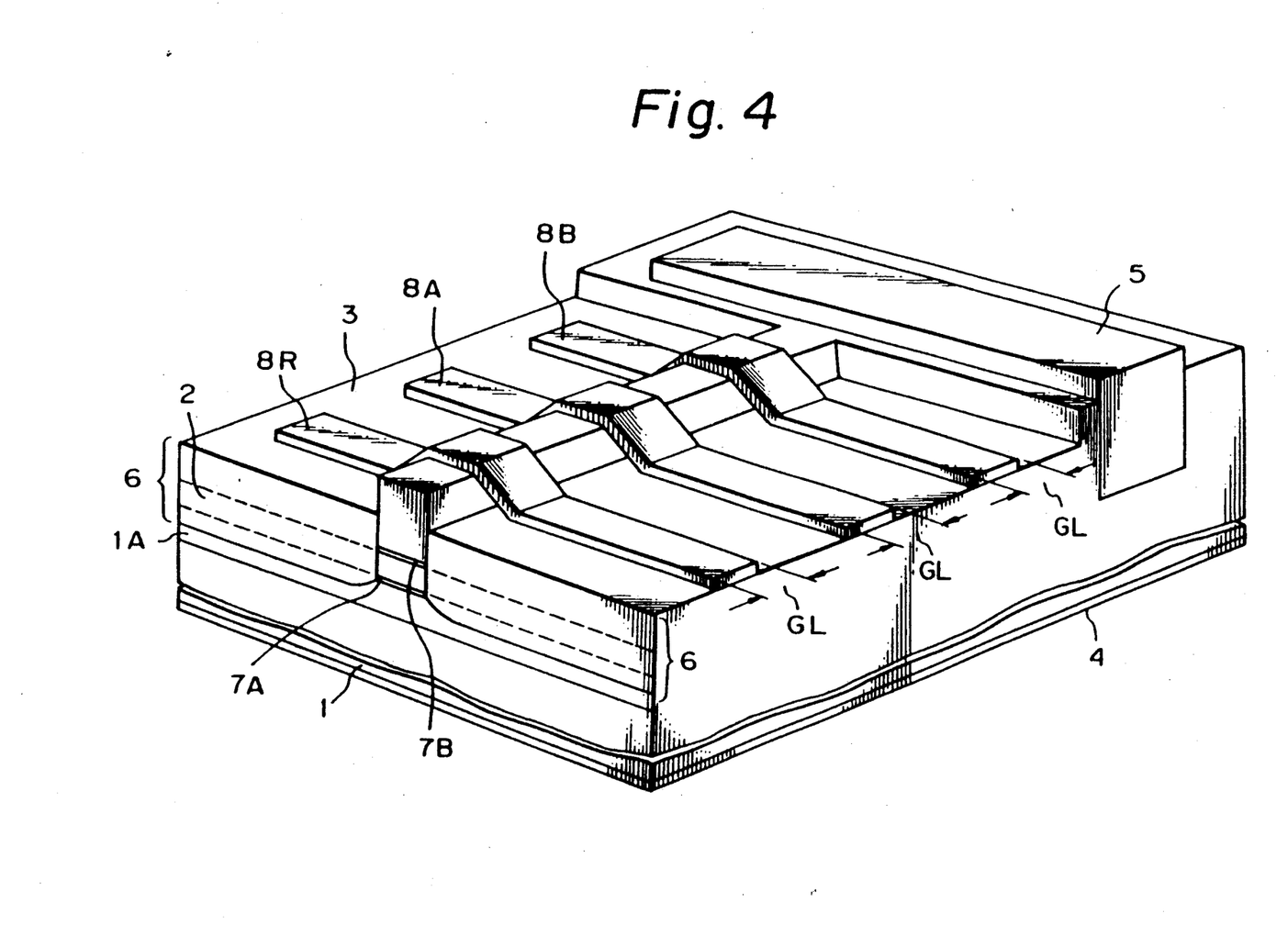
FIG. 4 is a partially cutaway perspective view of a first embodiment indicating an exclusive NOR circuit according to the present invention.

FIG. 4 shows a partially cutaway perspective view of a semiconductor functional element of a first embodiment for realizing an exclusive NOR circuit according to the present invention. In FIG. 4, reference numeral 1 denotes a substrate of undoped GaAs, 1A denotes a buffer layer of undoped GaAs, 2 denotes an n-type AlGaAs layer, 3 denotes a GaAs layer of undoped, 4 denotes a common electrode, 5 denotes an ohmic contact electrode, 6 denotes a depletion layer, 7A and 7B denote quantum thin lines, 8R, 8A, and 8B denote gate electrodes, and GL denotes the width of the gate electrodes 8R, 8A, and 8B. The quantum thin lines 7A and 7B are equal to the branch paths 11A and 11B in FIG. 1. The aim of using the quantum thin lines 7A and 7B as the branch paths 11A and 11B is to define the quantum interference effect, and the reason for this is that x-components of the electron wave becomes uniform when the quantum thin line is used to form the unidirectional channels for electrons.

In the semiconductor functional element as constructed above, the quantum thin lines 7A and 7B are developed using a two-dimensional electron gas layer produced at the GaAs side of the interface of the n-type AlGaAs layer 2, the substrate 1 of undoped GaAs, and the GaAs layer 3 of undoped GaAs. Further, the quantum thin line 7A constitutes a first branch path similar to the branch path 11A in FIG. 1 and the quantum thin line 7B constitutes a second branch path similar to the branch path 11B in FIG. 1 and both quantum thin lines 7A and 7B are electrically connected to the ohmic contact electrode 5. Accordingly, the quantum thin lines 7A and 7B are equivalent to bifurcated paths from the ohmic contact electrode 5. Note that the other sides of the quantum thin lines 7A and 7B are also connected to similar ohmic contact electrodes though this is not shown in FIG. 4. Furthermore, since the first and second branch paths 7A and 7B are composed of the quantum thin lines using the two-dimensional electron gas layer in the above described element, they can be substitued by a semiconductor thin film being able to form a quantum well or a quantum thin line using the same semiconductor thin film.

In this embodiment, the electric fields produced between the common electrode 4 and plural gate electrodes 8R, 8A, and 8B can be applied to the quantum thin line 7A of the first branch path and the quantum thin line 7B of the second branch path selectively, thereby causing a different phase shift in the wave function of electrons in a variety of ways. Further, it is possible to constitute a variety of semiconductor functional elements having different functions by increasing or decreasing the number of gate electrodes 8 or changing the width of the gate electrode GL.

Figure 5:
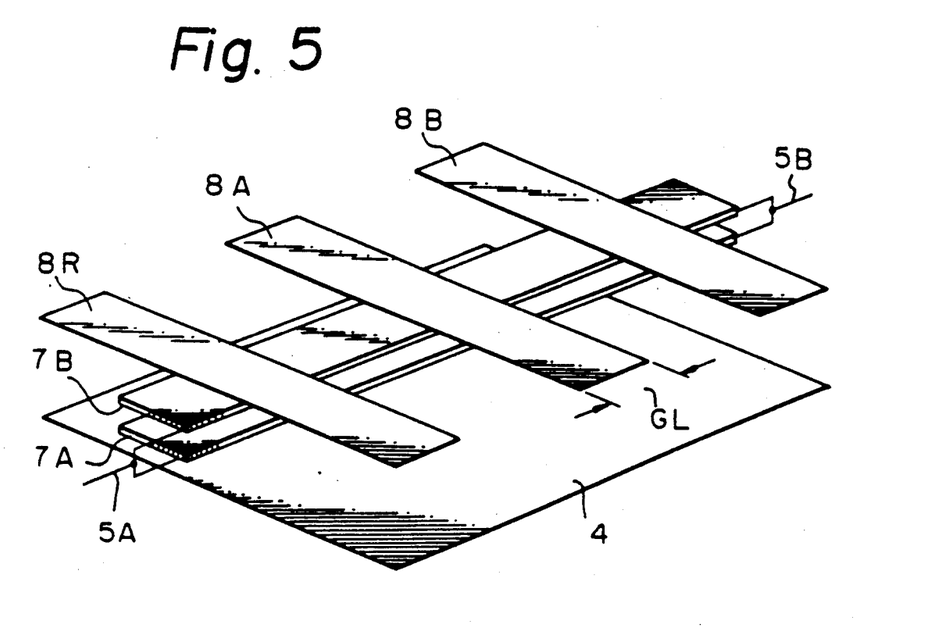
FIG. 5 is a rough skeletal view similar to FIG. 4, with unimportant parts omitted.

FIG. 5 is a rough skeletal view of the semiconductor functional element for realizing an exclusive NOR circuit similar to FIG. 4, with unimportant parts omitted. In FIG. 5, only the common electrode 4, the ohmic contact electrode 5A of the input side, the ohmic contact electrode 5B of the output side, the quantum thin lines 7A and 7B, and three gate electrodes 8R, 8A, and 8B are shown. The gate electrode 8R is provided to reset the input signal.

In this embodiment, the width GL of the gate electrode 8A and 8B are designed with a certain value to determine the phase difference value $\pi$ in the wave function when a certain voltage defined as "1" is applied to each electrode 8A and 8B. Also, the gate electrode 8R is used as a phase shifter for previously changing the phase of the input signal to make the output signal 0, when the applied voltage to both gate electrodes 8A and 8B is "0", and usually this gate electrode is designed to set the phase difference of the input signal $\pi$. The same gate electrode 8R described above will be used in the following embodiments.

Each electrode 8A and 8B is connected to the power source (not shown) via an independent ON-OFF switch (not shown), so that there are 4 combinations of voltage applied to the electrodes 8A and 8B. When the voltage is not applied to either electrode 8A or 8B, the phase difference value becomes $\pi$ by the electrode 8R as described above. When the voltage is applied to only one of the electrodes 8A or 8B, the total phase difference value becomes $2\pi$, since the phase difference is set to $\pi$ by the electrode 8R and also set to $\pi$ by the electrode 8A or 8B. When the voltage is applied to both electrodes 8A and 8B, the total phase difference value becomes $3\pi$, since the phase is set to $\pi$ by the electrode 8R and set to $2\pi$ by the electrodes 8A and 8B.

In the semiconductor functional element as constructed above, the input-output characteristics are shown in the following table 1, where "ON" is a state when the maximum current flows in this element, "OFF" is a state when the minimum current flows in this element.

TABLE 1

| 8A | 8B | OUTPUT |
|---|---|---|
| 0 | 0 | OFF |
| 0 | 1 | ON |
| 1 | 0 | ON |
| 1 | 1 | OFF | where "ON" is equal to "1" level and "OFF" is equal to "0" level.

It is clearly understood from the input-output characteristics of the table 1, that the first embodiment shown in FIGS. 4 and 5 has the function of an exclusive NOR logic circuit. Note that the output characteristics will all be inverted when the voltage is not applied to the electrode 8R, so that the electrode 8R of this embodiment can function as an inverter.

Figure 6:
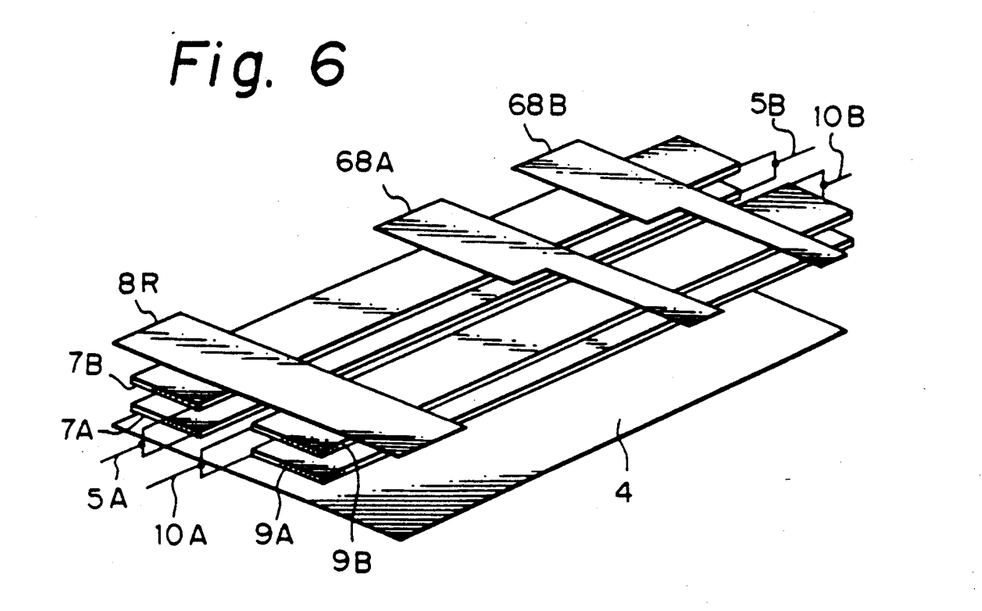
FIG. 6 is a rough skeletal view of a second embodiment indicating a half adder according to the present invention.

FIG. 6 is a rough skeletal view of the second embodiment according to the present invention for realizing a half adder where unimportant parts are omitted similar to FIG. 5 and the same reference numerals are used for the same structures. In FIG. 6, reference numerals 9A and 9B denote other quantum thin lines, 10A denotes the ohmic contact electrode of the input side, 10B denotes the ohmic contact electrode of the output side, and 68A and 68B denote electrodes of this embodiment. When the quantum thin lines 7A and 7B are used as a first channel and the quantum thin lines 9A and 9B are used as a second channel, the gate electrodes 68A and 68B have a different width in the first and the second channel. The width of the gate electrodes 68A and 68B in the first channel is twice as wide as the width on the second channel in this embodiment.

The width of each gate electrode 68A and 68B on the first channel is designed to give the phase difference value $\pi$ in the wave function respectively when they are connected to the power source equivalent to that of the first embodiment. Accordingly, the phase difference value given by one gate electrode 68A or 68B in the second channel is $\pi/2$ as they have a half width as compared with the width in the first channel.

Voltage can be applied to each electrode 68A or 68B independently, so that there are also 4 combinations of voltages applied to the electrodes 68A and 68B. When the voltage is not applied to either electrode 68A or 68B, the phase difference value becomes $\pi$ due to the electrode 8R as described before. When the voltage is applied to only one of the electrodes 68A or 68B, the total phase difference value in the first channel becomes $2\pi$ but the total phase difference value in the second channel becomes $3\pi/2$, since the phase difference is set to $\pi$ by the electrode 8R and also set to $\pi$ by the electrode 68A or 68B in the first channel, and $\pi/2$ by the electrode 68A or 68B in the second channel. When the voltage is applied to both electrodes 68A and 68B, the total phase difference value in the first channel becomes $3\pi$ but the total phase difference value in the second channel becomes $2\pi$, since the phase difference is set to $\pi$ by the electrode 8R and also set to $2\pi$ in the first channel, and $\pi$ in the second channel by the electrodes 68A and 68B.

In the semiconductor functional element as constructed above, the input-output characteristics are shown in the following table 2, where "ON" is a state when the maximum current flows in this element, "OFF" is a state when the minimum current flows in this element, "MEDIUM VALUE: OFF" is a state when the medium level current flows in this embodiment but it can be set to "OFF" by selecting a threshold level higher than the medium current level:

TABLE 2

| 68A | 68B | 1ST CHANNEL | 2ND CHANNEL |
|---|---|---|---|
| 0 | 0 | OFF | OFF |
| 0 | 1 | ON | MEDIUM VALUE:OFF |
| 1 | 0 | ON | MEDIUM VALUE:OFF |
| 1 | 1 | OFF | ON | where "ON" is equal to "1" level and "OFF" is equal to "0" level.

It is clearly understood from the input-output characteristics of the table 2, that the second embodiment shown in FIG. 6 has the function of a half adder logic circuit where the signals to the gate electrodes 68A and 68B are two input signals to the half adder, that is the first channel is a first column and the second channel is a shift column, when the element which has a higher threshold level than the medium current level is connected to the output ohmic contact electrode 10B.

Figure 7:
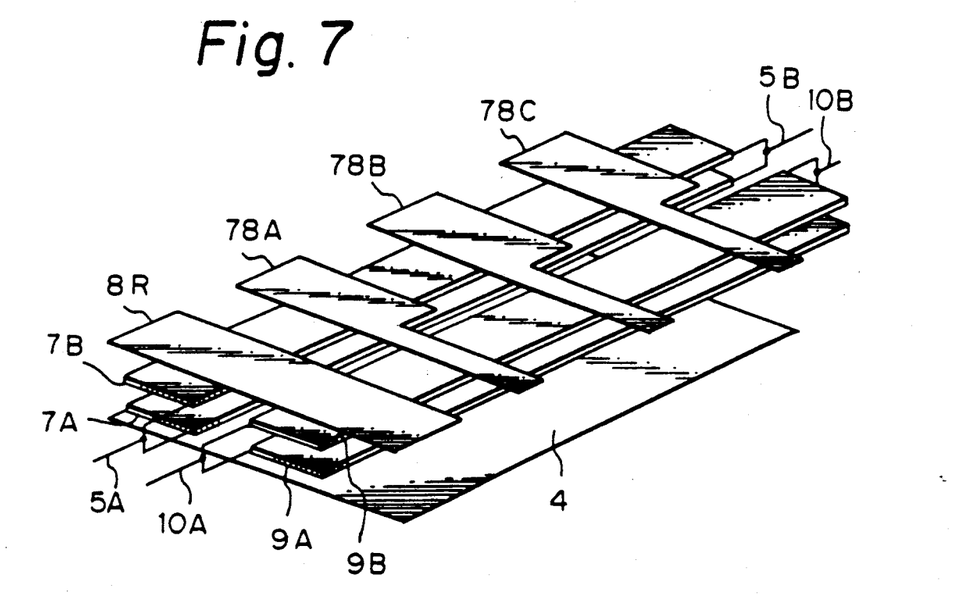
FIG. 7 is a rough skeletal view of a third embodiment indicating a full adder according to the present invention.

FIG. 7 is a rough skeletal view of the third embodiment according to the present invention for realizing a full adder where unimportant parts are omitted and the same reference numerals are used for the same structures similar to FIG. 6. In FIG. 7, reference numerals 78A, 78B, and 78C denote electrodes of this embodiment. The quantum thin lines 7A and 7B are used as a first channel and the quantum thin lines 9A and 9B are used as a second channel in this embodiment. Further, the gate electrodes 78A, 78B, and 78C have a different width in the first and the second channel, and the width of the gate electrodes 78A, 78B, and 78C in the first channel is three times the width of the second channel in this embodiment.

The width of each gate electrode 78A, 78B, and 78C in the first channel is designed to give the phase difference value $\pi$ in the wave function when they are connected to a power source equivalent to that of the first embodiment. Accordingly, the phase difference value given by one gate electrode 78A, 78B, or 78C in the second channel is $\pi/3$ as they have one third width of the first channel.

Voltage can be applied to each electrode 78A, 78B, or 78C independently, so that there are 8 combinations of voltages applied to the electrodes 78A, 78B, and 78C. When the voltage is not applied to any of electrodes 78A, 78B, or 78C, the phase difference value becomes $\pi$ due to the electrode 8R as described before. When the voltage is applied to only one of the electrodes 78A, 78B, or 78C, the total phase difference value in the first channel becomes $2\pi$, but the total phase difference value in the second channel becomes $4\pi/3$ since the phase is set to $\pi/3$ by any one of the electrodes 78A, 78B, or 78C in the second channel. When the voltage is applied to any two of the electrodes 78A, 78B, or 78C, the total phase difference value in the first channel becomes $3\pi$ but the total phase difference value in the second channel becomes $5\pi/3$ since the phase is set to $2\pi/3$ by any two of the electrodes 78A, 78B, or 78C in the second channel. When the voltage is applied to all electrodes 78A, 78B, and 78C, the total phase difference value in the first channel becomes $4\pi$, but the total phase difference value in the second channel becomes $2\pi$, since the phase is set to $\pi$ by three electrodes 78A, 78B, and 78C in the second channel.

In the semiconductor functional element as constructed above, the input-output characteristics are shown in the following table 3, where "ON" is a state when the maximum current flows in this element, "OFF" is a state when the minimum current flows in this element, "MEDIUM LOW LEVEL: OFF" is a state when the medium low level of current flows in this embodiment but it can be set to "OFF" by selecting a threshold level higher than the medium low current level, and "MEDIUM HIGH: ON" is a state when the medium high level of current flows in this embodiment but it can be set to "ON" by selecting a threshold level lower than the medium high current level:

TABLE 3

|     | 78A | 78B | 78C | 1ST CHANNEL | 2ND CHANNEL |
| --- | --- | --- | --- | --- | --- |
| (a) | 0 | 0 | 0 | OFF | OFF |
| (b) | 0 | 0 | 1 | ON | MEDIUM LOW LEVEL |
| (c) | 0 | 1 | 0 | ON | |
| (d) | 1 | 0 | 0 | ON | OFF |
| (e) | 0 | 1 | 1 | OFF | MEDIUM HIGH LEVEL |
| (f) | 1 | 0 | 1 | OFF | |
| (g) | 1 | 1 | 0 | OFF | ON |
| (h) | 1 | 1 | 1 | ON | ON | where "ON" is equal to "1" level and "OFF" is equal to "0" level.

It is clearly understood from the input-output characteristics of the table 3, from the third embodiment shown in FIG. 7 has the function of a full adder logic circuit where the signals to the gate electrodes 78A and 78B are two input signals to the adder, the signal to the gate electrode 78C is a carry input signal to the adder, the first channel is a first column and the second channel is a shift column, when the element whose threshold level is higher than the medium low current level and lower than the medium high current level is connected to the output ohmic contact electrode 10B.

Figure 8A:
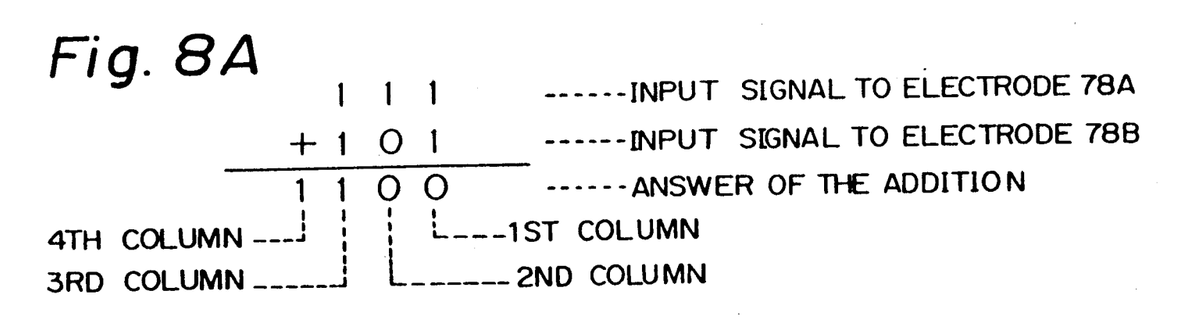
FIG. 8A shows a logic calculation process for explaining the operation of a full adder.
Figure 8B:
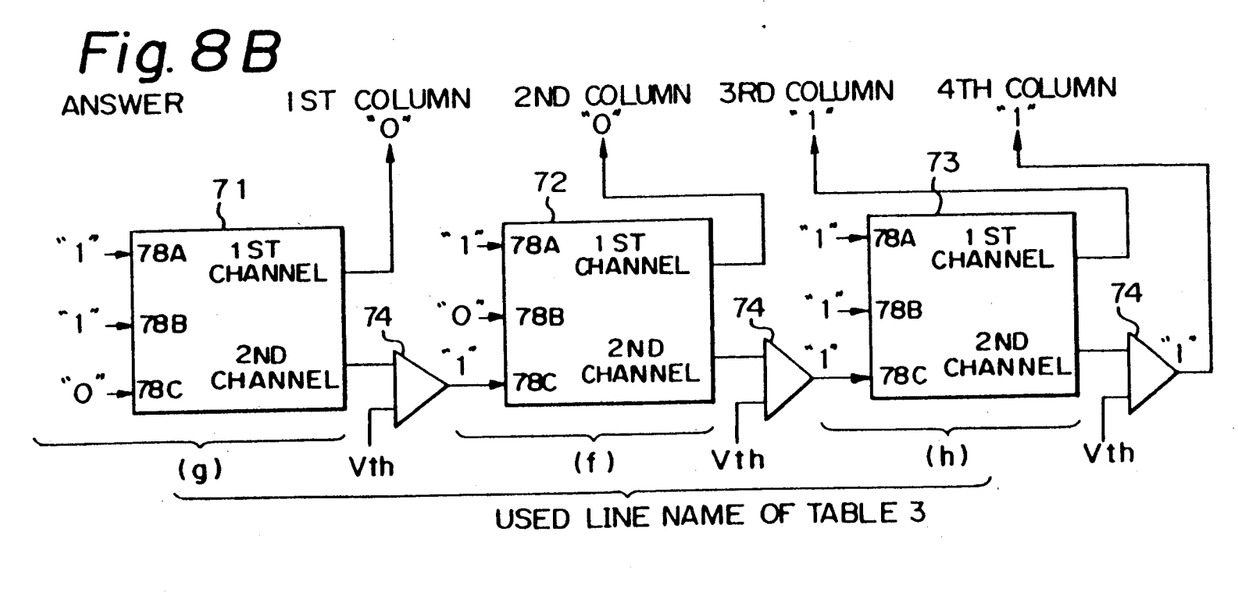
FIG. 8B is a circuit diagram of the full adder using the semiconductor functional elements shown in FIG. 7.

FIG. 8A shows one example of the binary adding calculation process of (1 1 1)+(1 0 1)=(1 1 0 0) carried out by the full adder. FIG. 8B is a circuit diagram of the full adder using the semiconductor functional elements shown in FIG. 7 to achieve a calculation shown in FIG. 8A. In FIG. 8B, three semiconductor functional elements 71, 72, 73 of the third embodiment are connected in series with the second channel being connected to the gate electrode 78C via a comparator 74 having a threshold input voltage Vth. This threshold input voltage Vth is higher than the voltage of medium low current and is lower than the voltage of medium high current. The semiconductor functional element 71 executes an adding calculation of the first column shown in FIG. 8A, whereby a signal "1" is appleied to electrodes 78A and 78B, and a signal "0" is applied to the electrode 78C. This logic state is the same as that shown in line (g) of Table 3, so that the output signal from the first channel which indicates the answer of the first column, is "0", and the output signal from the second channel whose current level is medium high, is converted to a signal "1" by the comparator 74 and then input into the electrode 78C of the semiconductor functional element 72 as a carry signal.

Figure 9:
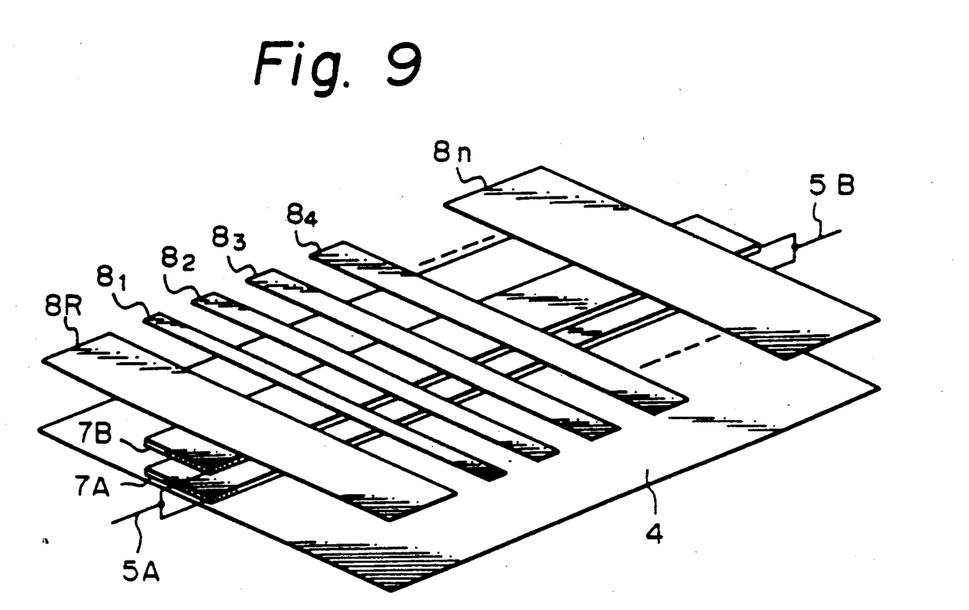
FIG. 9 is a rough skeletsl view of a fourth embodiment indicating an n bit D/A converter according to the present invention.

Similarly, the semiconductor functional element 72 executes an adding calculation of the second column shown in FIG. 8A, whereby a signal "1" is applied to electrodes 78A, a signal "0" is applied to electrode 78B, and the carry signal "1" is applied to the electrode 78C. This logic state is the same as shown in line (f) of Table 3, so that the output signal from the first channel which indicates the answer of the second column, "0", and the output signal from the second channel is converted to a carry signal "1" by the comparator 74. The semiconductor functional element 73 calculates the third column of the line (h) Table 3. In this way the circuit shown in FIG. 8B carries out the binary calculation shown in 8A.

fig. 9 is a rough skeletal view of the fourth embodiment according to the present invention for realizing an n bit D/A converter where unimportant parts are omitted similar to FIG. 5 and the same reference numerals are used for the same structures. In FIG. 9, reference numerals $8_1$ to $8_n$ denote gate electrodes of this embodiment. The width of the gate electrodes $8_1$ to $8_n$ are all different in this embodiment and each gate electrode $8_1$ to $8_n$ can be independently connected or disconnected to the power source (not shown) by a switch (not shown).

In this embodiment, the width of the Kth gate electrode $8_K$ is designed to give the phase difference $\phi_K$ in the electron wave function according to the following equation.

$$\phi_K = \frac{\pi}{2^n} \times 2^{K-1} \qquad \text{Eq. 3}$$

Namely, when the width of the first gate electrode $8_1$ is decided to be W, the width of the gate electrode $8_2$, $8_3$, $8_4$, ... $8_n$ is decided to be 2W, $2^2$W, $2^3$W, ... $2^{n-1}$W. Further, it is designed so that the total phase difference value becomes $\pi$ in the wave function in this embodiment when all of the electrodes $8_1$ to $8_n$ are connected to the power source. The voltage can be applied to each electrode $8_1$ to $8_n$ independently, so that there are also $2^n$ combinations of voltages applied to the electrodes $8_1$ to $8_n$. Accordingly, the phase difference value in this embodiment alternates from 0 to $\pi$ according to the selection of the gate electrode $8_1$ to $8_n$ without considering the phase difference value given by the electrode 8R, and the output level also alternates from 0 to the maximam voltage of the current.

Thus, when the phase difference $\Phi_P$ in the wave function shown in FIG. 2 is previously given by designing the width of the gate electrode 8R such as $\pi$, an if any point of the linear part $\Phi_n$ of the phase difference characteristic curve in FIG. 2 such as from $\Phi_L$ to $\Phi_H$ is selected by applying the proper voltage to some of the gate electrodes $8_1$ to $8_n$, a linear analog output signal from $G^L$ to $G_H$ can be obtained from the semiconductor functional element of the fourth embodiment and a D/A converter will be realized.

We claim:

1. A semiconductor functional element for forming one of a logic circuit and a functional unit comprising:
   a semiconductor having at least one bifurcated branch conductive path with a heterojunction in said semiconductor with a band discontinuity that produces a potential well;
   at least one pair of input/output electrodes located at both ends of each of said paths having an ohmic contact to both paths of said at least one bifurcated branch conductive path;
   at least two gate electrodes and a common electrode facing each other with said gate electrodes crossing both paths and said two gate electrodes are located outside of said one path, and said common electrode is located outside of said other path for applying a localized electric field on said heterojunctions; and
   switching means connected to said gate electrodes for independently switching a connection between the power source and said electrodes.

2. A semiconductor functional element as set forth in claim 1, wherein said bifurcated paths are equal in length.

3. A semiconductor functional element as set forth in claim 1, wherein said semiconductor is comprised of GaAlAs and GaAs layers.

4. A semiconductor functional element as set forth in claim 1, wherein said bifurcated branch conductive paths are the quantum thin lines.

5. A semiconductor functional element as set forth in claim 1, wherein a width of said gate electrode for each bifurcated branch conductive path is the same.

6. A semiconductor functional element as set forth in claim 5, wherein there is one bifurcated branch conductive path, an input electrode and an output electrode, three gate electrodes, and a common electrode, the width of each gate electrode is designed to give a phase difference value $\pi$ in the wave function when each gate electrode is connected to the power source and said semiconductor functional element operates as an exclusive NOR circuit.

7. A semiconductor functional element as set forth in claim 6, wherein said bifurcated paths are equal in length.

8. A semiconductor functional element as set forth in claim 6, wherein said semiconductor is comprised of GaAlAs and GaAs layers.

9. A semiconductor functional element as set forth in claim 6, wherein said bifurcated branch conductive paths are quantum thin lines.

10. A semiconductor functional element as set forth in claim 5, wherein the width of said gate electrodes stretching to a neighboring bifurcated branch conductive path is different.

11. A semiconductor functional element as set forth in claim 10, wherein there are two bifurcated branch conductive paths, an input electrode and an output electrode for a first one of said two paths, an input electrode and an output electrode for a second one of said two paths, three gate electrodes and a common electrode, the width of said gate electrodes is designed to give the phase difference value $\pi$ in the wave function and the width of said gate electrodes in designed to give the phase difference value $\pi$ in the wave function for a first portion of said paths and the phase difference $\pi/2$ in the wave function for a second portion of said paths when each of said gate electrodes is connected to the power source such that said semiconductor functional elements operates as a half adder.

12. A semiconductor functional element as set forth in claim 11, wherein said bifurcated paths are equal in length.

13. A semiconductor functional element as set forth in claim 11, wherein said semiconductor is comprised of GaAlAs and GaAs layers.

14. A semiconductor functional element as set forth in claim 11, wherein said bifurcated branch conductive paths are quantum thin lines.

15. A semiconductor functional element as set forth in claim 10, wherein there are two bifurcated branch conductive paths, an input electrode and an output electrode for a first one of said two paths, an input electrode and an output electrode for a second one of said two paths, four gate electrodes and a common electrode, the width of said gate electrodes is designed to give the phase difference value $\pi$ in the wave function and the width of said gate electrodes is designed to give the phase difference value $\pi$ in the wave function for a first portion of said paths and the phase difference vlaue $\pi/3$ in the wave function for a second portion of said paths when each of said gate electrodes is connected to the power source such that said semiconductor functional element operates as a full adder.

16. A semiconductor functional element as set forth in claim 15, wherein said bifurcated paths are equal in length.

17. A semiconductor functional element as set forth in claim 15, wherein said semiconductor is comprised of GaAlAs and GaAs layers.

18. A semiconductor functional element as set forth in claim 15, wherein said bifurcated branch conductive path are quantum thin lines.

19. A semiconductor functional element as set forth in claim 1, wherein the width of said gate electrode for each bifurcated branch conductive path is different.

20. A semiconductor functional element as set forth in claim 19, wherein there is one bifurcated branch conductive path, an input electrode and an output electrode, n+1 gate electrodes and a common electrode, the width of said gate electrode is designed to give the phase difference value $\pi$ in the wave function and the width of said gate electrodes is designed to give the phase difference value in the wave function when each gate electrode is connected to the power source such that said semiconductor functional element operates as a D/A converter.

21. A semiconductor functional element as set forth in claim 20, wherein said bifurcated paths are equal in length.

22. A semiconductor functional element as set forth in claim 20, wherein said semiconductor is comprised of GaAlAs and GaAs layers.

23. A semiconductor functional element as set forth in claim 20, wherein said bifurcated branch conductive paths are quantum thin lines.

* * * * *